US012568725B2

(12) United States Patent      (10) Patent No.:   US 12,568,725 B2

Shi et al.      (45) Date of Patent:     Mar. 3, 2026

(54) LED CHIP AND LIGHT EMITTING DEVICE

(71) Applicant: Hubei Sanan Optoelectronics Co., Ltd., Ezhou (CN)

(72) Inventors: Baojun Shi, Ezhou (CN); Jin Xu, Ezhou (CN); Dazhong Chen, Ezhou (CN); Shuijie Wang, Ezhou (CN); Ke Liu, Ezhou (CN); Qiang Wang, Ezhou (CN); Meijian Wu, Ezhou (CN)

(73) Assignee: Hubei Sanan Optoelectronics Co., Ltd., Ezhou (CN)

( * ) Notice: Subject to any disclaimer, the term of this patent is extended or adjusted under 35 U.S.C. 154(b) by 372 days.

(21) Appl. No.: 18/460,711

(22) Filed: Sep. 5, 2023

(65) Prior Publication Data

US 2024/0079541 A1     Mar. 7, 2024

(30) Foreign Application Priority Data

Sep. 7, 2022    (CN) ......................... 202211087178.5

(51) Int. Cl.
| | |
|---|---|
| *H10H 20/857* | (2025.01) |
| *H01L 25/075* | (2006.01) |
| *H10H 20/815* | (2025.01) |

(52) U.S. Cl.
CPC ....... *H10H 20/857* (2025.01); *H01L 25/0753* (2013.01); *H10H 20/815* (2025.01)

(58) Field of Classification Search
CPC .............. H01L 25/0753; H10H 20/815; H10H 20/832; H10H 20/82; H10H 20/831; H10H 20/841; H10H 20/857
See application file for complete search history.

(56) References Cited

U.S. PATENT DOCUMENTS

| | | | | |
|---|---|---|---|---|
| 2014/0312369 | A1* | 10/2014 | Yoon | H10H 20/84 |
| | | | | 257/96 |
| 2014/0361327 | A1* | 12/2014 | Chae | H10H 20/825 |
| | | | | 257/98 |
| 2016/0260869 | A1* | 9/2016 | Jeon | H10H 20/832 |
| 2019/0181300 | A1* | 6/2019 | Park | H10H 20/8312 |
| 2021/0098526 | A1* | 4/2021 | Cho | H01L 25/0753 |
| 2021/0328106 | A1* | 10/2021 | Kopp | H10H 20/8312 |
| 2022/0216375 | A1* | 7/2022 | Niwa | H10H 20/84 |
| 2023/0035901 | A1* | 2/2023 | Niwa | H10H 20/835 |
| 2023/0077302 | A1* | 3/2023 | Huang | H10H 20/832 |

(Continued)

*Primary Examiner* — Victor A Mandala

(74) *Attorney, Agent, or Firm* — Hemisphere Law, PLLC

(57) ABSTRACT

Provided are an LED chip and a light emitting device, which include a light emitting epitaxial layer, a first insulating layer covering the light emitting epitaxial layer, and a first pad and a second pad located on the first insulating layer. Each of the first pad and the second pad includes a stress buffer layer, a nickel metal layer, and a protective layer. The stress buffer layer includes aluminum metal layers; and by adjusting the thickness distribution of the aluminum metal layers, an aluminum metal layer closest to the nickel metal layer is set to be the thickest, and the aluminum metal layers are thickened, especially the thickness of the aluminum metal layer closest to the nickel metal layer is greater than or equal to the thickness of the nickel metal layer, therefore, the ductility and tensile property of aluminum metal are utilized to play a role in stress buffering.

20 Claims, 3 Drawing Sheets

(56) References Cited

U.S. PATENT DOCUMENTS

| | | | |
|---|---|---|---|
| 2023/0127400 A1* | 4/2023 | Lan | H10H 20/835 |
| | | | 257/98 |
| 2023/0215985 A1* | 7/2023 | Tseng | H10H 20/812 |
| | | | 257/99 |
| 2024/0088329 A1* | 3/2024 | Kim | H10D 86/441 |
| 2024/0322086 A1* | 9/2024 | Jiang | H10H 20/825 |

* cited by examiner

LED CHIP AND LIGHT EMITTING DEVICE

TECHNICAL FIELD

The present disclosure relates to the technical field of semiconductor light emitting devices, and in particular to a light emitting diode (LED) chip and a light emitting device.

BACKGROUND

A GaN-based flip-chip semiconductor diode chip (i.e., LED chip) has advantages of good heat dissipation, high luminous efficiency, and good stability, and is increasingly favored by the market. A high-voltage chip can simplify a driving power supply. The combination of the above two chips can play a greater advantage.

The GaN-based flip-chip semiconductor diode chip includes a semiconductor light emitting layer and two electrode pads with different electrical properties disposed on the semiconductor light emitting layer. The two electrode pads are used to mount the GaN-based flip-chip semiconductor diode chip on a circuit substrate by solder paste combined with a reflow soldering process to form a packaged product. Alternatively, surfaces of the electrode pads are provided with a tin metal layer and then mounted on a circuit board by the reflow soldering process. Each of the electrode pads usually further includes a nickel metal layer. On one hand, the nickel metal layer can form eutectic with the tin metal layer after the reflow soldering process to realize the connection between the chip and the circuit substrate. On the other hand, the nickel metal layer should have a sufficient thickness to prevent the tin metal layer from diffusing into the GaN-based flip-chip semiconductor diode chip. However, since a stress of the nickel metal layer is large, it is found that for a highly flexible substrate, in a process of use, a physical stress caused by the nickel metal layer will cause the GaN-based flip-chip semiconductor diode chip to fall off during bending of the flexible substrate. The electrode pads of the GaN-based flip-chip semiconductor diode chip is directly combined with the flexible substrate, so it is necessary to optimize and improve the electrode pads of the GaN-based flip-chip semiconductor diode chip to solve the stress impact on the GaN-based flip-chip semiconductor diode chip when the flexible substrate is bent, avoid the chip from falling off, and increase the reliability of the GaN-based flip-chip semiconductor diode chip.

In the related art, it is proposed to set a stress buffer layer to buffer the stress of the nickel metal layer. However, the arrangement of the existing stress buffer layer cannot achieve the best stress buffer effect, and it is difficult to meet the reliability requirements of mounting the chip on the highly flexible substrate.

SUMMARY

In view of the shortcomings of the related art mentioned above, objectives of the present disclosure is to provide an LED chip, which is used to solve the problem that it is easy to fall off when combined with a flexible substrate in the related art. According to the present disclosure, by changing a structure of an electrode pad and even an internal design of a stress buffer layer, the impact of an external stress on the LED chip is better buffered, and an anti-dropping effect is achieved.

In order to achieve the above objectives and other related objectives, the present disclosure provides an LED chip, which includes:

a light emitting epitaxial layer;

a first insulating layer, disposed to cover a top and a sidewall of the light emitting epitaxial layer, where the first insulating layer has multiple through holes; and a first pad and a second pad with opposite electrical properties, each of the first pad and the second pad is disposed on the first insulating layer and filled in the multiple through holes of the first insulating layer to electrically connect the light emitting epitaxial layer;

where each of the first pad and the second pad includes a stress buffer layer and a nickel metal layer sequentially stacked from bottom to top, the stress buff layer includes multiple aluminum metal layers, and a thickness of an aluminum metal layer closest to the nickel metal layer of the multiple aluminum metal layers is greater than that of any one remaining aluminum metal layer.

As described above, the present disclosure provides an LED chip and a light emitting device. The LED chip includes a light emitting epitaxial layer, a first insulating layer covering the light emitting epitaxial layer, and a first pad and a second pad disposed on the first insulating layer. Further, each of the first pad and the second pad includes a stress buffer layer, a nickel metal layer, and a protective layer. Specifically, the stress buffer layer includes multiple aluminum metal layers, and the multiple aluminum metal layers are thickened by adjusting the thickness distribution of the multiple aluminum metal layers, especially the thickness of the aluminum metal layer closest to the nickel metal layer is greater than or equal to the thickness of the nickel metal layer, so that the ductility and tensile property of aluminum metal are utilized to play the role of stress buffering, and the ductility of the aluminum metal can well bear the stress impact caused by the bending of a substrate, so that an electrode is prevented from being broken or falling off, and the reliability is improved. The titanium metal layer between the aluminum metal layer closest to the nickel metal layer and the nickel metal layer is the thickest among multiple titanium metal layers, which can enhance the adhesion and protection function.

DESCRIPTION OF REFERENCE SYMBOLS

11: first contact electrode; 12: first pad; 21: second contact electrode; 22: second pad; 23: transparent conductive layer; 24: barrier layer; 31: interconnection electrode; 33: transparent conductive layer; 34: barrier layer; 40: groove; 101: substrate; 102: light emitting epitaxial layer; 103: first insulating layer; 104: second insulating layer; 110: first stepped surface; 220: adhesion layer; 221: stress buffer layer; 222: nickel metal layer; 223: protective layer; 1021: first-conductivity-type semiconductor layer; 1023: active layer; 1022: second-conductivity-type semiconductor layer; 2212: titanium metal layer; 2211: aluminum metal layer.

DETAILED DESCRIPTION OF EMBODIMENTS

First Embodiment

Figure 1:
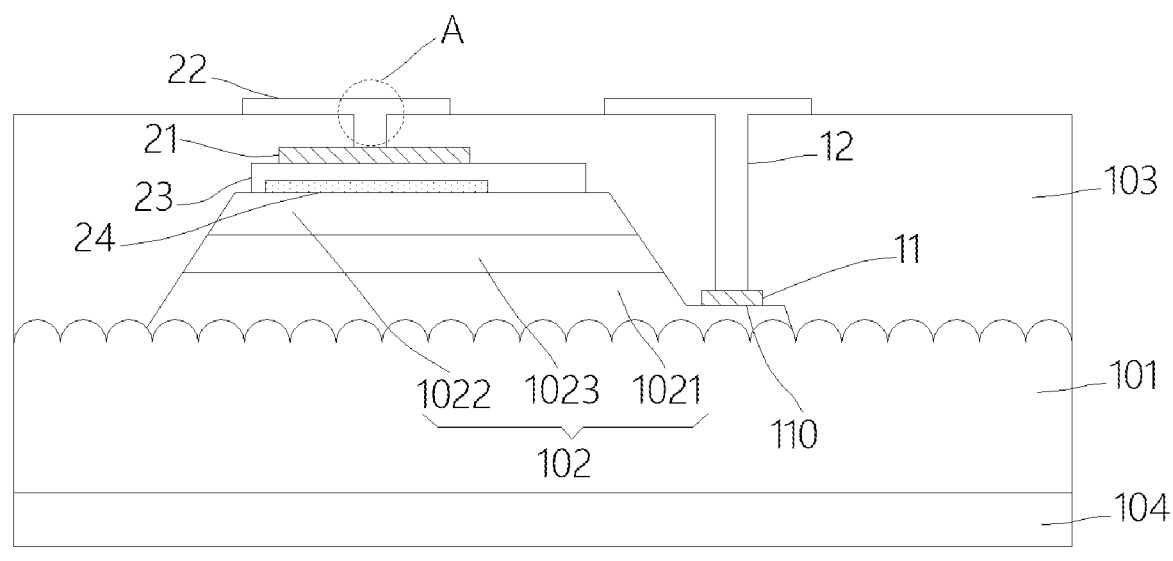
FIG. 1 illustrates a schematic structural view of an LED chip according to an embodiment of the present disclosure.
Figure 2:
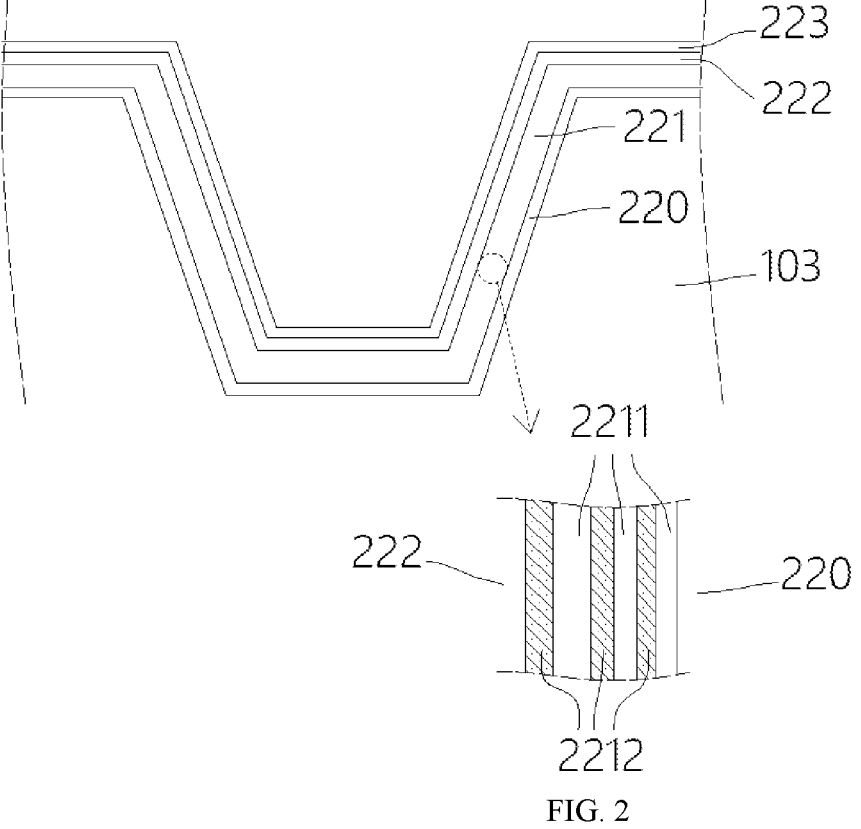
FIG. 2 illustrates an enlarged schematic view of an area A in FIG. 1.

As illustrated in FIGS. 1 and 2, a first embodiment of the present disclosure provides an LED chip, which specifically includes a light emitting epitaxial layer 102, a first insulating layer 103, and a first pad 12 and a second pad 22 with opposite electrical properties.

Specifically, the first insulating layer 103 is disposed to cover a top and a sidewall of the light emitting epitaxial layer 102, and the first insulating layer 103 has multiple through holes. It should be noted that, the sidewall of the light emitting epitaxial layer 102 refers to the whole sidewalls of the light emitting epitaxial layer 102.

The first pad 12 and the second pad 22 are disposed on the first insulating layer 103 and filled in the multiple through holes of the first insulating layer 103 to electrically connect the light emitting epitaxial layer 102.

Each of the first pad 12 and the second pad 22 includes an adhesion layer 220, a stress buffer layer 221, a nickel metal layer 222, and a protective layer 223 which are sequentially stacked from bottom to top.

The adhesion layer 220 is in contact with the first insulating layer 103. Specifically, the first insulating layer 103 is a titanium metal layer. The adhesion layer 220 mainly plays an adhesion role, so that the pads can be stably attached to the first insulating layer 103. A thickness of the adhesion layer 220 is in a range of 0.1 nm to 10 nm, and thus the adhesion layer 220 can have certain light permeability.

Further, the stress buffer layer 221 includes pairs of periodically arranged aluminum metal layers 2211 and titanium metal layers 2212. The aluminum metal layers 2211 and the titanium metal layers 2212 are alternately stacked. One titanium metal layer 2212 is in contact with the nickel metal layer 222. One aluminum metal layer 2211 is in contact with the adhesion layer 220, and a thickness of the aluminum metal layer 2211 closest to the nickel metal layer 222 is greater than that of any one remaining aluminum metal layer 2211.

The nickel metal layer 222 includes nickel metal, and the protective layer 223 includes a gold metal layer. Through the stress buffering effect of aluminum and titanium layers on the nickel metal layer (nickel layer), the risk that the pads are easy to fall off due to excessive stress of the nickel metal layer can be reduced. An aluminum layer needs to be layered, and the aluminum metal layer 2211 in contact with the adhesion layer 220 can play a reflective role. In an illustrated embodiment, 3-5 pairs of periodically arranged aluminum metal layers 2211 and titanium metal layers 2212 are disposed, in which one aluminum metal layer is used as a reflective layer, and each of the remaining aluminum metal layers is set to at least two layers, which can prevent each layer of aluminum from being too thick, whereas too thick aluminum layer can result in unstable aluminum migration performance.

In an illustrated embodiment, the aluminum metal layer 2211 closest to the nickel metal layer 222 of the aluminum metal layers 2211 is the thickest, and the other aluminum metal layers 2211 of the aluminum metal layers 2211 are equal in thickness.

In an illustrated embodiment, thicknesses of the aluminum metal layers 2211 are gradually increased in a direction approaching the nickel metal layer 222.

The titanium metal layers 2212 are disposed between the aluminum metal layers 2211 and the nickel metal layer 222 and can protect the aluminum metal layer 221, can play the role of stress transition between the aluminum metal layer 2211 and the nickel metal layer 222, and can also play the role of adhesion, so that the nickel metal layer 222 can be stably attached to the layers below the nickel metal layer 222.

A layer in contact with the adhesion layer 220 is the aluminum metal layer 2211, and one titanium metal layer 2212 is disposed between the nickel metal layer 222 and the aluminum metal layer 2211 closest to the nickel metal layer 2211.

In an illustrated embodiment, a thickness of a titanium metal layer 2211 closest to the nickel metal layer 222 of the multiple titanium metal layers 2211 is greater than a thickness of any one remaining titanium metal layer 2211, and thus the titanium metal layers 2211 can play a sufficient adhesion and protection role.

On the one hand, when the LED chip and a driving substrate are soldered with solder paste, a partial thickness of nickel metal layer 222 and solder paste are combined to form eutectic alloy by the solder paste combined with a reflow soldering process. On the other hand, the nickel metal layer 222 can prevent the solder paste from penetrating into other metal layers (especially the stress buffer layer 221) to form melting damage. The protective layer 223 can protect the nickel metal layer 222 from oxidation before the LED chip is mounted on the driving substrate.

Further, a thickness of the nickel metal layer 222 is in a range of 200 nm to 1200 nm. If the substrate is a flexible substrate, for example, the reflow soldering process is further performed twice, the thickness of the nickel metal layer 222 can be appropriately increased to increase a thickness of an eutectic layer formed by the nickel metal layer 222 and the solder paste, and improve the crystal fixing ability. In an embodiment, the thickness of the nickel metal layer 222 is in a range of 500 nm to 1200 nm. In an embodiment, the thickness of the nickel metal layer 222 is more than 550 nm, specifically, is in a range of 550 nm to 1000 nm. In an embodiment, the thickness of the nickel metal layer 222 is in a range of 600 nm to 800 nm, so as to ensure that the nickel metal layer 222 can fully combine with the solder paste during welding and can prevent the solder paste from penetrating into other metal layers.

Further, in an embodiment, the stress buffer layer 221 includes 2-5 pairs of periodically arranged aluminum metal layers 2211 and titanium metal layers 2212. In an embodiment, a thickness of each titanium metal layer 2212 is in a range of 60 nm to 300 nm. In an embodiment, the thickness of the titanium metal layer 2212 closest to the nickel metal layer 222 is in a range of 100 nm to 300 nm, and the thickness of any one remaining titanium metal layer 2212 is in a range of 50 nm to 150 nm. In an embodiment, a thickness of each aluminum metal layer 2211 is in a range of 300 nm to 2000 nm. In an embodiment, the thickness of the aluminum metal layer 2211 closest to the nickel metal layer 222 is in a range of 800 nm to 2000 nm, and the thickness of any one remaining aluminum metal layer 2211 is in a range of 300 nm to 1500 nm. In a specific embodiment, in each period (one period corresponding to one titanium metal layer 2212 and one aluminum metal layer 2211), a ratio of a thickness of a titanium metal layer 2212 to a thickness of an aluminum metal layer 2211 is less than or equal to 1:3. In a specific embodiment, a ratio of the thickness of the aluminum metal layer 2211 closest to the nickel metal layer 222 in the stress buffer layer 221 to a thickness of the nickel metal layer 222 is greater than or equal to 1:1.

In an embodiment, the stress buffer layer 221 includes three pairs of periodically arranged aluminum metal layers 2211 and titanium metal layers 2212, a thickness of a titanium metal layer 2212 closest to the nickel metal layer 222 of the three titanium metal layers 2212 is 150 nm, a thickness of each of the other two titanium metal layers 2212 is 120 nm, the thickness of the aluminum metal layer 2211 closest to the nickel metal layer 222 of the three aluminum metal layers 2211 is 1500 nm, and a thickness of each of the other two aluminum metal layers 2211 is 550 nm.

In an embodiment, the thickness of each aluminum metal layer 2211 can also be appropriately increased, even greater than or equal to the thickness of the nickel metal layer 222, so as to improve the buffering capacity.

Specifically, because aluminum has good ductility and tensile strength, by adjusting the thickness distribution of the aluminum metal layers 2211, the aluminum metal layer 2211 closest to the nickel metal layer 222 is set to be the thickest among the aluminum metal layers 2211, and the titanium metal layer 2212 between the aluminum metal layer 2211 closest to the nickel metal layer 222 and the nickel metal layer 222 is the thickest among the multiple titanium metal layers 2212, which can enhance the adhesion and protection, and thus better play the role of stress buffering. After the diode is combined with the flexible substrate, the ductility of the diode can well bear the stress impact caused by the bending of the flexible substrate, thereby avoiding the electrode from breaking or falling off, and increasing the reliability.

In the above solutions, the effect is better when the thickness of the aluminum metal layer 2211 closest to the nickel metal layer 222 exceeds the thickness of the nickel metal layer 222. It should be understood that in FIG. 1, only setting positions of the pads is schematically shown, and actual pads are not a plug-like structures, but are closer to the laminated structures in FIG. 2. Even though FIG. 2 only shows the structure of the second pad 22, a structure of the first pad 12 is the same as that of the second pad 22.

Specifically, the light emitting epitaxial layer 102 includes a first-conductive-type semiconductor layer 1021, an active layer 1023, and a second-conductive-type semiconductor layer 1022 which are stacked in sequence. The first pad 12 is electrically connected to the first-conductive-type semiconductor layer 1021, and the second pad 22 is electrically connected to the second-conductive-type semiconductor layer 1022. The light emitting epitaxial layer 102 is formed on a substrate 101, and the substrate 101 can be made of one of a transparent material, a translucent material or a non-transparent material. For example, the substrate 101 can be any one of silicon carbide, silicon, magnesium aluminum oxide, magnesium oxide, gallium nitride, or sapphire. In this embodiment, the substrate 101 can be a sapphire substrate 101. An upper surface of the substrate 101 may have a patterned structure (i.e., protrusions shown in the drawings), which can improve the external light extraction efficiency and epitaxial layer crystal quality of the light emitting epitaxial layer 102. As an example, the patterned structure of the upper surface of the substrate 101 may be formed into various shapes, such as a cone, a triangular cone, a hexagonal cone, and a cone-like.

The first pad 12 is electrically connected to a first stepped surface 110 on a surface of the first-conductive-type semiconductor layer 1021, which is a common structure of LED chips. The first stepped surface 110 is usually obtained by etching a part of the second-conductive-type semiconductor layer 1022 and the active layer 1023 after epitaxy. The first stepped surface 110 enable the part of the second-conductive-type semiconductor layer 1022 and the active layer 1023 to be removed, exposing part of an upper surface of the first-conductive-type semiconductor layer 1021. The first stepped surface 110 may be multiple in number, and the first stepped surface 110 may be located inside the light emitting epitaxial layer 102, or at an edge region of the light emitting epitaxial layer 102, or both inside and at the edge region of the light emitting epitaxial layer 102 for electrode connection.

Further, the first insulating layer 103 has a reflection function for reflecting a light emitted by the active layer 1023. The first insulating layer 103 may have a distributed Bragg reflection (DBR) structure. In an embodiment, the first insulating layer 103 includes at least one of SiO2, SiN, SiOxNy, $TiO_2$, $Si_3N_4$, $Al_2O_3$, TiN, or AlN. In this embodiment, the DBR structure is taken as an example, the DBR structure is a periodic structure composed of two materials with different refractive indexes alternately arranged in a ABAB mode, for example, it can be the alternating arrangement of $TiO_2$ and $SiO_2$. When the DBR structure is selected as the first insulating layer 103, a thickness thereof is 1 micron or more. In this embodiment, a second insulating layer 104 is also formed on a lower surface of the substrate 101, so that reflection is simultaneously formed on the upper and lower parts of the epitaxial layer, and thus the light can be emitted from the side. Similar to the first insulating layer 103, the second insulating layer 104 also has a reflection function and may be a DBR structure. In addition, the first insulating layer 103 needs to have good insulating performance to block conductive materials with different polarities in the LED chip.

Further, a first contact electrode 11 is disposed between the first pad 12 and the light emitting epitaxial layer 102, and a second contact electrode 21 is disposed between the second pad 22 and the light emitting epitaxial layer 102. Each of the first contact electrode 11 and the second contact electrode 21 can be a metal electrode, which can be one or at least two of nickel, gold, chromium, titanium, platinum, palladium, chromium, aluminum, tin, and indium. In an embodiment, each of the first contact electrode 11 and the second contact electrode 21 can include a bottom layer (for example, Cr), a reflective layer (for example, Al) on the bottom layer, and a cover layer (for example, Ti, Pt, or Ni) on the reflective layer. The bottom layer can ensure the ohmic contact effect between a corresponding electrode and the light emitting epitaxial layer 102, and a thickness of the bottom layer is within 10 nm, thereby avoiding the influence on the reflectivity.

Further, a barrier layer 24 and a transparent conductive layer 23 are disposed between the second contact electrode 21 and the light emitting epitaxial layer 102 (i.e., the second-conductivity-type semiconductor 1022), and the barrier layer 24 is sandwiched between the light emitting epitaxial layer 102 and the transparent conductive layer 23. The second contact electrode 21 corresponds to the barrier layer 24 (also referred to as current block (CB)) up and down, that is to say, a projection of the second contact electrode 21 on the barrier layer 24 is located inside the barrier layer 24. The barrier layer 24 is used to block a current, so as to prevent the current from being crowded right below the second contact electrode 21, and thus the current is scattered. The transparent conductive layer 23 serves as a channel through which the current flows. Through this design, the current flows through an entire surface of the second-conductive-type semiconductor layer 1022 through the transparent conductive layer 23, so as to avoid current crowding and ensure the current to spread as far as possible on the surface of the second-conductive-type semiconductor layer 1022, and thus improve the luminous efficiency. In an embodiment, the barrier layer 24 may be $SiO_2$, $Si_3N_4$, SiON, or a composite structure thereof. The transparent conductive layer 23 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), or gallium-doped zinc oxide (GZO). In this embodiment, the transparent conductive layer 23 is an ITO (semiconductor transparent conductive film of indium tin oxide) layer formed by vapor deposition or sputtering.

Table 1 below shows a comparative experiment. In three groups of comparative examples, only thicknesses of aluminum metal layers of the stress buffer layer are adjusted and tested under the same cold and hot shock condition. Specifically, the chip is die-bonded on a flexible printed circuit board (FPC) by a process of soldering paste and reflow soldering, and cold and hot shock is carried out at a temperature between −45° C. and 125° C., and a conversion period is 10 seconds (s). And then after long-term tests of 1008 hours (H) and 2016 H, a falling percentage of pads, i.e., a defective rate, is observed, and the number of tested LED chips is 300.

From the experimental results, compared with a first comparative example, in a second comparative example, a thickness of each aluminum metal layer in the stress buffer layer is increased, and its defective rate is decreased significantly under cold and hot shock. Compared with the first comparative example, in the third comparative example, only the thickness of the aluminum metal layer closest to the nickel metal layer is increased, and its defective rate drops to 0 under cold and hot shock, which has a more significant decline. It can be seen that increasing the thickness of aluminum metal layer to be greater than that of the nickel metal layer can make the ductility and tensile strength of the aluminum metal layer play a better stress buffering role and prevent the electrode from breaking or falling off. Especially, when the aluminum metal layer closest to the nickel metal layer thickened, a better anti-dropping effect can be achieved.

taxial layer 102 is divided into n sub-chips arranged in sequence, including a first sub-chip, a second sub-chip, . . . , an n-th sub-chip, where 2≤n. Adjacent sub-chips are separated by a groove 40 penetrating through the light emitting epitaxial layer 102, and the adjacent sub-chips are electrically connected by an interconnection electrode 31.

Further, the interconnection electrode 31 is configured to connect a second-conductive-type semiconductor layer 1022 of a k-th sub-chip to a first-conductive-type semiconductor layer 1021 of a k+1-th sub-chip via a corresponding groove 40, where 1≤k≤n−1. The first pad 12 is electrically connected to a first-conductive-type semiconductor layer 1021 of the first sub-chip, and the second pad 22 is electrically connected to a second-conductive-type semiconductor layer 1022 of the n-th sub-chip.

Figure 3:
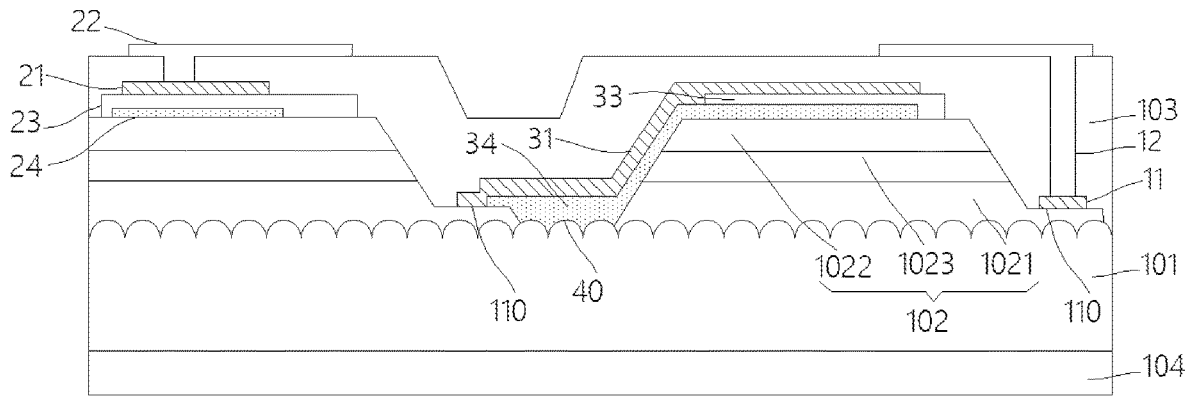
FIG. 3 illustrates a schematic structural view of an LED chip having two sub-chips.
Figure 4:
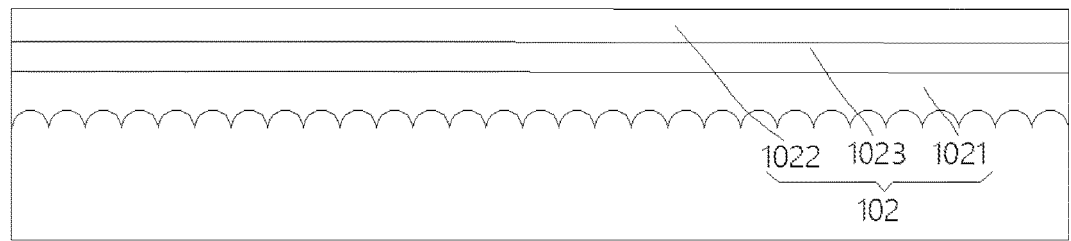
FIGS. 4-9 illustrate a manufacturing process of an LED chip.

Specifically, a structure as shown in FIG. 3 corresponds to n=2, the interconnection electrode 31 is configured to connect the second-conductivity-type semiconductor 1022 of the first sub-chip to the first-conductivity-type semiconductor 1021 of the second sub-chip through the groove 40. It should be understood that a structure corresponding to n=3 or more than 3 is similar to the structure corresponding to n=2, as long as the interconnection electrode 31 is correspondingly disposed between the k-th sub-chip and the k+1-th sub-chip. Structures of the first pad 12 and the second pad 22 in this embodiment are the same as those in the first embodiment. Further, a first contact electrode 11, a second contact electrode 21, a barrier layer 24, and a transparent conductive layer 23 can be disposed between a pad and the light emitting epitaxial layer 102, a specific structure of which can refer to the above relevant description in the first embodiment, which will not be repeated herein. The interconnection electrode 31 is made of the same material as the first contact electrode 11 or the second contact electrode 21 and can include a bottom layer (for example, Cr), a reflective layer on the bottom layer (for example, Al), and a cover layer on the reflective layer (for example, Ti, Pt, or Ni), and the interconnection electrode 31 is made and formed simultaneously with the first contact electrode 11 and the second contact electrode 21.

Further, a barrier layer 34 is provided between the interconnection electrode 31 and the light emitting epitaxial layer 102, and a transparent conductive layer 33 is provided

TABLE 1

| | First comparative example | Second comparative example | Third comparative example |
|---|---|---|---|
| Composition and corresponding thickness (nm) of each layer | Adhesion layer (Ti): 10 Stress buffer layer (Al/Ti/Al/Ti/Al/Ti): 550/120/550/120/550/150 Nickel metal layer (Ni): 750 Protective layer (Au): 100 | Adhesion layer (Ti): 10 Stress buffer layer (Al/Ti/Al/Ti/Al/Ti): 850/120/850/120/850/150 Nickel metal layer (Ni): 750 Protective layer (Au): 100 | Adhesion layer (Ti): 10 Stress buffer layer (Al/Ti/Al/Ti/Al/Ti): 550/120/550/120/1500/150 Nickel metal layer (Ni): 750 Protective layer (Au): 100 |
| Defective rate under cold and hot shock | 1008H (defective rate 50%) 2016H (defective rate 95%) | 1008H (defective rate 1%) 2016H (defective rate 10%) | 1008H (defective rate 0%) 2016H (defective rate 0%) |

Second Embodiment

This embodiment also provides an LED chip, which is similar to the LED chip in the first embodiment, except that a light emitting epitaxial layer 102 in this embodiment is divided into multiple sub-chips connected with each other.

As shown in FIG. 3, the LED chip specifically includes a light emitting epitaxial layer 102. The light emitting epibetween the barrier layer 34 on the second-conductive-type semiconductor layer 1022 and the interconnection electrode 31 of the k-th sub-chip.

Specifically, similar to the barrier layer 24 and the transparent conductive layer 23 in the first embodiment, the barrier layer 34 is sandwiched between the light emitting epitaxial layer 102 and the interconnection electrode 31. The interconnection electrode 31 corresponds to the barrier layer

34 (also referred to as current block (CB)) up and down, that is to say, a projection of the interconnection electrode 31 on the barrier layer 34 is located inside the barrier layer 34; The barrier layer 34 is used to block a current, so as to prevent the current from being crowded right below the intercon- nection electrode 31, and thus the current is scattered. The transparent conductive layer 33 serves as a channel through which the current flows. Through this design, the current flows through an entire surface of the second-conductive- type semiconductor layer 1022 through the transparent con- ductive layer 33, so as to avoid current crowding and ensure the current to spread as far as possible on the surface of the second-conductive-type semiconductor layer 1022, and thus improve the luminous efficiency. In an embodiment, the barrier layer 34 may be $SiO_2$, $Si_3N_4$, SiON, or a composite structure thereof. The transparent conductive layer 33 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), or gallium-doped zinc oxide (GZO). In this embodiment, the transparent conductive layer 33 is an ITO (semiconductor transparent conductive film of indium tin oxide) layer formed by vapor deposition or sputtering.

Referring to FIGS. 4-9, a preparation method of the LED chip in this embodiment specifically includes the following steps.

Figure 5:
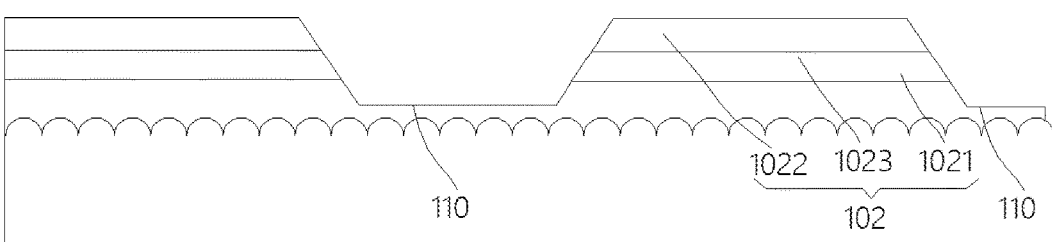

The second-conductivity-type semiconductor 1022 and the active layer 1023 are etched to form the first stepped surface 110, as shown in FIG. 5.

Figure 6:
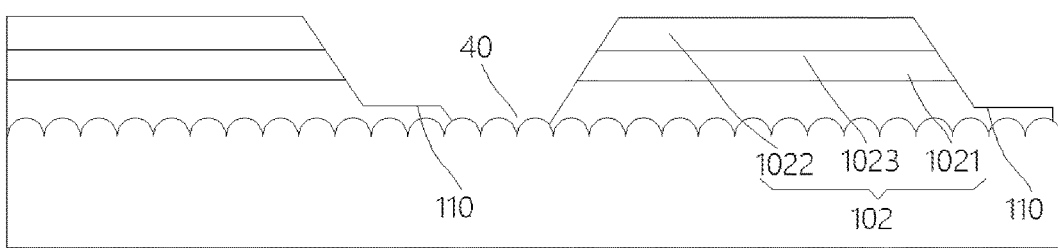

Next, the first-conductive-type semiconductor layer 1021 is etched at the first stepped surface 110 to form the groove 40 penetrating the light emitting epitaxial layer 102, thereby dividing the light emitting epitaxial layer 102 into multiple sub-chips, as shown in FIG. 6.

Figure 7:
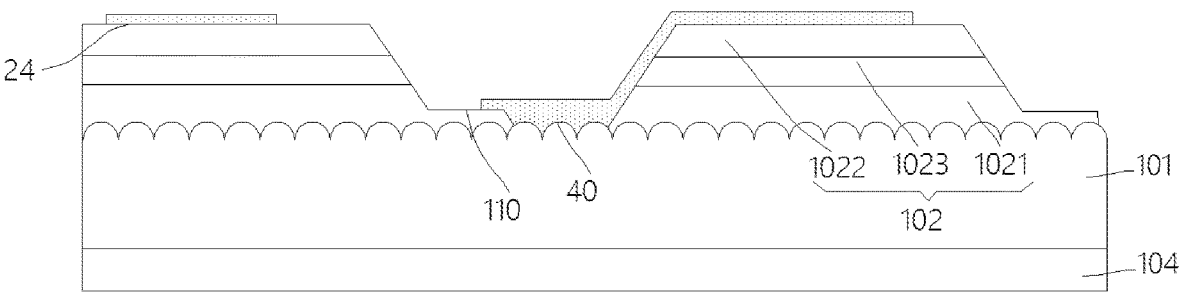

Next, the barrier layer 24 and the barrier layer 34 are formed simultaneously, as shown in FIG. 7.

Figure 8:
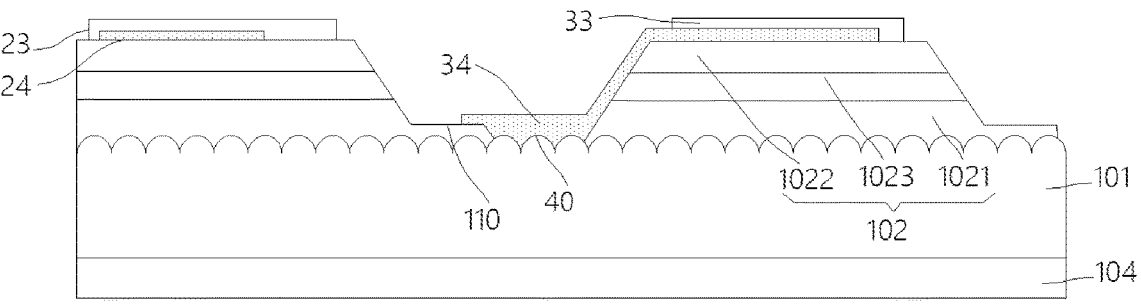

Next, the transparent conductive layer 23 and the trans- parent conductive layer 33 are formed simultaneously, as shown in FIG. 8.

Figure 9:
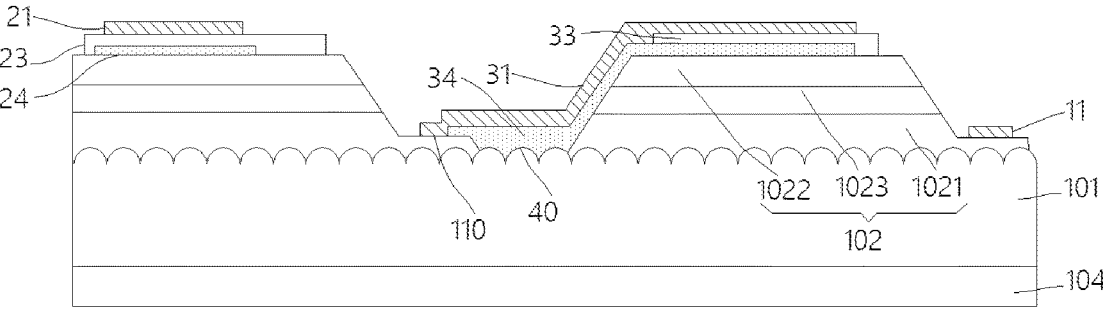

Next, the interconnection electrode 31, the first contact electrode 11, and the second contact electrode 21 are formed synchronously, as shown in FIG. 9.

Next, the first insulating layer 103 is formed, through holes are formed in the first insulating layer 103, and finally the first pad 12 and the second pad 22 are formed on the first insulating layer 103, as shown in FIG. 3.

Second Embodiment

In each above embodiment, the nickel metal layer is independently used as a welding layer. As another embodi- ment, each of the first pad 12 and the second pad 22 includes a tin metal layer in addition to the nickel metal layer; that is to say, the nickel metal layer and the tin metal layer together form a welding layer. Alternatively, a thickness of the tin metal layer is in a range of 4 microns to 30 microns, and the tin metal layer is located above the nickel metal layer. With the tin metal layer, a process of brushing solder paste can be avoided, when the chip is mounted on a substrate.

In summary, the present disclosure provides an LED chip and a light emitting device. The LED chip includes a light emitting epitaxial layer, a first insulating layer covering the light emitting epitaxial layer, and a first pad and a second pad located on the first insulating layer. Each of the first pad and the second pad includes a stress buffer layer, a nickel metal layer, and a protective layer. Specifically, the stress buffer layer includes multiple aluminum metal layers; and by adjusting the thickness distribution of the aluminum metal layers, the aluminum metal layer closest to the nickel metal layer is set to be the thickest, and the aluminum metal layers are thickened, especially the thickness of the alumi- num metal layer closest to the nickel metal layer is greater than or equal to the thickness of the nickel metal layer, so that the ductility and tensile property of aluminum metal are utilized to play a role in stress buffering. After the diode is combined with a flexible substrate, the ductility of the diode can well bear the stress impact caused by the bending of the substrate, thereby avoiding the electrode from breaking or falling off, and increase the reliability. The titanium metal layer between the aluminum metal layer closest to the nickel metal layer is the thickest among multiple titanium metal layer, which can enhance the adhesion and protection of the LED chip.

The above-mentioned embodiments only illustrate the principle and efficacy of the present disclosure, and are not intended to limit the present disclosure. The skilled in the art who is familiar with this technology can modify or change the above embodiments without violating the spirit and scope of the present disclosure. Therefore, all equivalent modifications or changes made by the person with ordinary knowledge in the technical field without departing from the spirit and technical ideas disclosed in the present disclosure should still be covered by the claims of the present disclo- sure.

What is claimed is:

1. A light emitting diode (LED) chip, comprising:
   a light emitting epitaxial layer;
   a first insulating layer, disposed to cover a top and a sidewall of the light emitting epitaxial layer, wherein the first insulating layer has a plurality of through holes; and
   a first pad and a second pad with opposite electrical properties, wherein each of the first pad and the second pad is disposed on the first insulating layer and filled in the plurality of through holes of the first insulating layer to electrically connect the light emitting epitaxial layer;
   wherein each of the first pad and the second pad com- prises a stress buffer layer and a nickel metal layer sequentially stacked from bottom to top, the stress buff layer comprises a plurality of aluminum metal layers, and a thickness of an aluminum metal layer closest to the nickel metal layer of the plurality of aluminum metal layers is greater than that of any one remaining aluminum metal layer.

2. The LED chip according to claim 1, wherein a thick- ness of the nickel metal layer is in a range of 500 nanometers (nm) to 1200 nm, the stress buffer layer further comprises a plurality of titanium metal layers, the plurality of titanium metal layers are alternately stacked with the plurality of aluminum metal layers to make the plurality of titanium metal layers and the plurality of aluminum metal layers be arranged periodically.

3. The LED chip according to claim 2, wherein a thick- ness of each of the plurality of titanium metal layers is in a range of 60 nm to 300 nm.

4. The LED chip according to claim 2, wherein the stress buffer layer comprises 2-5 pairs of periodically arranged titanium metal layers and aluminum metal layers.

5. The LED chip according to claim 2, wherein in each period, a ratio of a thickness of a titanium metal layer to a thickness of an aluminum metal layer is less than or equal to 1:3.

6. The LED chip according to claim 2, wherein a ratio of the thickness of the aluminum metal layer closest to the nickel metal layer in the stress buffer layer to the thickness of the nickel metal layer is greater than or equal to 1:1.

7. The LED chip according to claim 2, wherein a thickness of a titanium metal layer closest to the nickel metal layer of the plurality of titanium metal layers is greater than a thickness of any one remaining titanium metal layer.

8. The LED chip according to claim 7, wherein the thickness of the titanium metal layer closest to the nickel metal layer of the plurality of titanium metal layers is in a range of 100 nm to 300 nm, and the thickness of any one remaining titanium metal layer is in a range of 50 nm to 150 nm.

9. The LED chip according to claim 2, wherein one of the plurality of titanium metal layers is in direct contact with the nickel metal layer.

10. The LED chip according to claim 2, wherein each of the first pad and the second pad further comprises a tin metal layer, the tin metal layer is disposed on a side of the nickel metal layer facing away from the stress buffer layer, and a thickness of the tin metal layer is in a range of 4 microns to 30 microns.

11. The LED chip according to claim 5, wherein the stress buffer layer comprises 3-5 pairs of periodically arranged titanium metal layers and aluminum metal layers, the aluminum metal layer closest to the nickel metal layer of the plurality of aluminum metal layers is the thickest, and the other aluminum metal layers of the plurality of aluminum metal layers are equal in thickness.

12. The LED chip according to claim 11, wherein the thickness of the aluminum metal layer closest to the nickel metal layer of the plurality of aluminum metal layers is in a range of 800 nm to 2000 nm, and a thickness of each of the other aluminum metal layers of the plurality of aluminum metal layers is in a range of 300 nm to 1500 nm.

13. The LED chip according to claim 5, wherein thicknesses of the plurality of aluminum metal layers are gradually increased in a direction approaching the nickel metal layer.

14. The LED chip according to claim 2, wherein each of the first pad and the second pad further comprises an adhesion layer, the adhesion layer is disposed on a side of the stress buffer layer facing away from the nickel metal layer, one of the plurality of aluminum metal layers is in direct contact with the adhesion layer, the adhesion layer is a titanium metal layer, and a thickness of the adhesion layer is in a range of 0.1 nm to 10 nm.

15. The LED chip according to claim 4, wherein the stress buffer layer comprises three pairs of periodically arranged titanium metal layers and aluminum metal layers, a thickness of a titanium metal layer closest to the nickel metal layer of the plurality of titanium metal layers is 150 nm, a thickness of each of the other two titanium metal layers is 120 nm, the thickness of the aluminum metal layer closest to the nickel metal layer of the plurality of aluminum metal layers is 1500 nm, and a thickness of each of the other two aluminum metal layers is 550 nm.

16. A light emitting device, comprising the LED chip according to claim 1.

17. An LED chip, comprising:
a light emitting epitaxial layer;
a first insulating layer, disposed to cover a top and a sidewall of the light emitting epitaxial layer, wherein the first insulating layer has a plurality of through holes; and
a first pad and a second pad with opposite electrical properties, wherein each of the first pad and the second pad is disposed on the first insulating layer and filled in the plurality of through holes of the first insulating layer to electrically connect the light emitting epitaxial layer;
wherein each of the first pad and the second pad comprises a stress buffer layer and a nickel metal layer sequentially stacked from bottom to top, the stress buffer layer comprises pairs of periodically arranged aluminum metal layers and titanium metal layers, and a thickness of a titanium metal layer closest to the nickel metal layer is greater than that of any one remaining titanium metal layer.

18. The LED chip according to claim 17, wherein a thickness of the nickel metal layer is in a range of 600 nm to 800 nm.

19. The LED chip according to claim 17, wherein each of the first pad and the second pad further comprises a protective layer, the protective layer is stacked on a side of the nickel metal layer facing away from the stress buffer layer, and the protective layer is a gold metal layer.

20. The LED chip according to claim 17, wherein a thickness of each of the aluminum metal layers is in a range of 300 nm to 2000 nm.

\* \* \* \* \*